United States Patent [19]

Oddi et al.

[11] 4,376,815

[45] Mar. 15, 1983

[54] METHOD OF APPLYING PHOTORESIST BY SCREENING IN THE FORMATION OF PRINTED CIRCUITS

[76] Inventors: Michael J. Oddi, 64 Fairfax St., Burlington, Mass. 01803; Alfred P. Orio, 26 River St., Westford, Mass. 01886

[21] Appl. No.: 87,223

[22] Filed: Oct. 22, 1979

[51] Int. Cl.$^3$ .................................................. G03C 5/00
[52] U.S. Cl. ..................................... 430/313; 427/160; 427/282; 430/314; 430/308; 430/318; 430/319; 430/323; 430/324; 430/935
[58] Field of Search ............... 430/308, 313, 314, 318, 430/323, 324, 327, 935, 319; 427/160, 282

[56] References Cited

U.S. PATENT DOCUMENTS 3,629,036 12/1971 Isaacson .......................... 430/327 X
4,003,877 1/1977 Lipson et al. .................... 430/308 X
4,176,602 12/1979 Feddersen .......................... 430/308

Primary Examiner—Jack P. Brammer

[57] ABSTRACT

This invention is directed to processes for using a light sensitive photoresist material in the manufacture of an article having a surface permanently modified in an image pattern. The process comprises applying the photoresist to a substrate through a screen, preferably as a continuous, incompletely imaged layer and thereafter, imaging and developing to provide a relief image in the photoresist layer and treating the substrate to provide a permanent image in the finished article. The process is particularly useful in the manufacture of printed circuits. The process is believed to be a departure from conventional processes in the step of screening a light sensitive photoresist material over a substrate.

18 Claims, No Drawings

METHOD OF APPLYING PHOTORESIST BY SCREENING IN THE FORMATION OF PRINTED CIRCUITS

BACKGROUND OF THE INVENTION

1. Introduction

This invention is directed to the manufacture of articles having an imaged surface and more particularly, is directed to a process for applying a light sensitive photoresist material in a novel manner in the manufacture of such articles.

2. Description of the Prior Art

Resists are used in the manufacture of numerous items to provide a relief image over a substrate. One of the largest uses of resists is in the manufacture of printed circuits where the circuit is typically first defined by a resist image of the desired circuit over a suitable substrate such as a phenolic or glass-filled epoxy substrate.

In the manufacture of printed circuits, primarily two types of resists are used. For low cost printed circuits, resists are used that are not light sensitive and the relief image is provided by application of the resist over the substrate directly in the image pattern. For those printed circuits requiring greater precision and detail and where higher cost is justified, light sensitive resists are used where the resist is applied as a continuous layer and the relief image is formed in the layer by exposure to a source of activating radiation through a master followed by chemical development of the exposed layer to provide the relief image.

Resists which are not light sensitive are applied to a circuit board substrate material in a relief image pattern, most frequently by screening through a stencil. The technique of screen printing is particularly adaptable to low cost printed circuits where the ultimate in resolution and definition is not required. Basically, the process involves a screening operation which depends upon the transfer of a resist, frequently to a copper-clad laminate surface, using a stencil where the openings in the stencil define the circuit pattern. The stencil is firmly attached to the surface of a silk, nylon or stainless steel screen stretched drum-head tight over a frame suspended a short distance above the surface of the substrate. Resist is forced through the open areas of the screen and onto the laminate by the wiping motion of a rubber squeegie. This results in the resist defining the desired circuit pattern. The remaining steps for the formation of a printed circuit comprise drying the resist, and where the resist has been applied over a copper-clad substrate, etching the exposed copper whereby the copper remaining defines the circuit pattern. Details of screening resists over a substrate in the manufacture of printed circuits can be found in Coombs, *Printed Circuit Handbook*, McGraw-Hill Book Company, New York, 1967, pages 4-25 to 4-36; Scarlett, *Printed Circuit Boards For Microelectronics*, Van Nostram-Reinholdt Company, London, 1970, pages 39 and 40; Draper, *The production of Printed Circuits and Electronic Assemblies*, Robert Draper Ltd., Teddington, October, 1969, pages 57-60; and Schlabach, *Printed and Intergrated Circuits, Materials and Processes*, McGraw-Hill Book Company, New York, 1963, pages 83-89; all incorporated herein by reference.

There are cost advantages to the use of screen resists. The resists are low cost materials which do not require special care in their use other than ordinary cleanliness. The screen material used is inexpensive and the preparation of a screen bearing the desired circuit image is a low cost process. Once the screen is formed, it can be repeatedly reused for printing multiple substrates. The screening process may be performed by relatively untrained technicians or may be performed using automated equipment. The coatings obtained are uniform and of good quality. Finally, from the standpoint of material consumption, notwithstanding that the screen resists are relatively low cost materials, there is little waste of material in the screening process, thus resulting in even greater cost efficiency.

Offsetting the cost advantages enumerated above, screen resists cannot be used for the manufacture of printed circuits where precision and definition are required. When the resist is squeezed through the screen under pressure, the pressure causes the resist to flow both through screen openings and beneath the screen resulting in spreading of the lines. In addition, with use, the screens stretch and successive substrates coated with screen resists are out of registration with each other. As a consequence, fine line circuit definition is unavailable using screening processes. Where precision and definition are required, the industry uses light sensitive resists. These materials are capable of being imaged and developed with photographic resolution.

Photoresists may be negative or positive acting materials. Both comprise light sensitive materials in a resin binder. If the resist is a negative acting resist, the exposed areas are hardened by light exposure whereas, positive resists are solubilized by such light exposure. The various types of photoresists available and their formulations are set forth in DeForest, *Photoresist, Materials and Processes*, McGraw-Hill Book Company, New York, 1975, pages 4 and 5 and 19 through 61; and *Printed Circuit Handbook*, supra, pages 4-11 through 4-17, both incorporated herein by reference.

There are several methods for applying photoresists to circuit board substrate materials. The most common wet methods comprise dip coating, whirl coating, roller coating, curtain coating and spray coating.

Dip coating comprises immersing a substrate to be coated into a tank containing photoresist. It is an easy and quick way of coating both sides of a substrate, but after the coated substrate is removed from the tank and as the photoresist drains from the substrate, there is a tendency for streaks to form resulting in coatings of uneven thickness and therefore, incomplete or uneven development may occur. Moreover, with through hole substrates, there is a tendency for the resist to run into and plug the through holes.

Whirl coating utilizes centrifugal force to distribute the resist over an area to be coated. The coatings have a more uniform thickness than coatings obtained by dip coating though there is a tendency for the coating to be thinner in the center than along the edges. A major disadvantage of whirl coating is encountered with double-sided boards, especially those having through holes. Resist tends to run around the edge or through the holes causing streaks on the reverse side, again resulting in incomplete or uneven development. Another disadvantage is substantial loss of resist during the coating process as it is spun off the edge of the substrate and generally, more than fifty percent of the resist is lost.

All photoresists can be roller coated except those of low viscosity. Roller coaters utilize rollers having soft surfaces such as surfaces of rubber that are grooved or knurled whereby the roller can act as a reservoir for the resist. A major problem with roller coating arises from spreading the resist over the large surface of the roller in a relatively thin cross section. This results in excessive exposure of the resist to air which can degrade the resist, particularly negative acting resists which are frequently oxygen sensitive.

Spray coating can use common paint spray equipment and practically all resists can be spray coated. Major objections to this process are high cost due to over-spray resulting in an uneven coating and wasted resist and excessive solvent emissions due to the high solvent content necessary to provide resists of sufficiently low viscosity for spraying.

From the above, it is apparent that screening is a method for applying resists which are not light sensitive to obtain uniform coatings without wasting large volumes of resist, but this process cannot be used where fine image resolution is required. Alternatively, the methods associated with the application of light sensitive resists provide fine image resolution, but coatings of uniform thickness are difficult to obtain and considerable resist is wasted in the process significantly increasing the cost of manufacture.

SUMMARY OF THE INVENTION

In accordance with the present invention, a light sensitive photoresist material, of a viscosity suitable for screening, is screened as an incompletely imaged layer through a suitable screen and dried. The so-coated substrate is then imaged by exposure through a suitable master to a source of activating radiation, developed and treated to form a permanent pattern in conventional manner. The procedure of the subject invention provides the benefits of screening whereby resist layers of uniform thickness are obtained without waste of material and the fine line imagery normally associated with the use of light sensitive resists.

DESCRIPTION OF THE PREFERRED EMBODIMENTS

The application of a light sensitive photoresist by screening in accordance with the invention is a mechanical procedure applicable to substantially all photoresist formulations regardless of the chemistry of the photoresist, though the positive working photoresists are more readily adapted to screening than the negative resists. Negative and positive working resists are described by DeForest, supra, pages 19 to 62. Positive working photoresists are preferred for purposes of this invention because they are oxygen insensitive, provide better resolution than negative resists and may be imaged several times. Such resists are more fully described by Kosar, *Light Sensitive Systems*, John Wiley and Sons, Incorporated, New York, 1965, pages 194 to 214 and 336 to 352, also incorporated herein by reference. Preferred photoresists for purposes of this invention are described in U.S. Pat. No. 3,402,044 incorporated herein by reference. The photoresists of said patent comprise naphthoquinone-diazide sulfonic acid esters in a resin system of a Novolac resin and an alkali resistant film forming material. Another class of suitable photoresists are disclosed in U.S. Pat. No. 3,637,832, a diazo oxide such as N-dehydroabietyl-6-diazo-5(6H)-oxo-1-naphthalene sulfonamide, preferably contained in a terpolymer resin system containing carboxyl groups.

The chemical composition of a photoresist prepared for screening in accordance with this invention need not vary markedly from that of a photoresist designed for coating by spray coating, dip coating or the like. The major alteration in the resist is in its flow characteristics. In this respect, the flow properties of the resist are altered so that the resist does not run through the screen in the absence of pressure and does not run off the substrate following screening. In general, the flow properties are altered primarily by increasing the viscosity of the photoresist. In general, the viscosity of the resist formulation should be sufficient to prevent the resist from passing through the screen in the absence of pressure, but insufficient to interfere with the resist passing through the screen when pressure is applied to the resist by use of a squeegie. Preferably, the viscosity of the resist is at least 500 centipoise at 25° C., and more preferably, varies between 2,000 and 15,000 centipoises. It should be recognized that resists at the low end of the viscosity range are used with screens having a high mesh count and resists at the upper end of the viscosity range would be used with the coarser screens.

There are several methods by which the viscosity of a light sensitive photoresist may be increased. One method comprises the addition of a filler to the formulation that does not substantially interfere with the photosensitive properties of the photoresist. Transluscent fillers are preferred. Finely divided pigments such as silicon dioxide sold under the Tradename Cab-o-sil can be used and such fillers effectively increase the viscosity of the formulation. In general, the use of fillers is a lesser preferred embodiment because they make it more difficult to obtain thin coatings. An alternative and preferred method for increasing the viscosity of a photoresist is by increasing the solids content of the formulation. In this respect, it has been found that for the preferred photoresist formulations noted above, a solids content of at least 30 percent by weight of the total formulation is necessary and preferably, the solids content ranges between about 30 and 60 percent of the total weight of the formulation.

In formulating a photoresist formulation useful for screening, it is also desirable to alter the solvent system for the photoresist substituting high boiling solvents such as carbitol acetate for the low boiling solvents frequently used in such resists such as Cellosolve and xylene. By this substitution, the drying time of the resist is prolonged which is advantageous to the formation of coatings using screening methods. It is also preferable to use essentially a single solvent to the extent possible.

In order to obtain screened coatings that are smooth, it is desirable to add a levelling agent to the resist formulation to eliminate craters and bubbles. Known levelling agents for light insensitive screen resists are suitable for purposes of this invention. Fatty alcohols, acids and esters are preferred, oleyl, linoleyl and linolenyl alcohols being most preferred. The concentration of the levelling agent can vary from 1 to 20% by weight of the solids.

The light sensitive photoresists of this invention are screened onto a suitable substrate in essentially the same manner as the non-light sensitive screen resists of the prior art except that it is not necessary that the resist be screened through a stencil in an image pattern. Instead, the resist is screened onto the substrate in an incompete pattern. By incomplete, it is meant that exposure and development are required to complete the image pattern. In this respect, the resist is usually screened onto the substrate as a continuous, non-imaged layer. However, some portion of the image may be stenciled over the screen if desired. For example, when screening the photoresist over a substrate having through holes, it may be desirable to put a plug on the screen over each through hole to prevent plugging of the through holes with the resist. Thereafter, the completed image pattern is formed by exposure of the screened, dried coating of the photoresist to activating radiation in an image pattern followed by development of the imaged resist layer.

The coating thickness of a screened photoresist layer depends, for the most part, upon the viscosity of the light sensitive resist and the screen used in the coating process. For example, using a positive working photoresist of a naphthoquinone-diazide sulfonic acid ester sensitizer in a binder formulation of a Novolac resin having a total solids content of 58 percent and a viscosity of 10,000 centipoise at 25° C., wet and dry coating thicknesses can be obtained for various sized screens as set forth in the following table:

| Mesh Count Per Inch[1] | Thread Diameter (Microns) | Mesh Opening (Microns) | Open Surface (%) | Wet Thickness (Microns) | Dry Thickness (Microns)[2] |
|---|---|---|---|---|---|
| 330T | 38 | 37 | 23 | 6 | 4 |
| 280T | 36 | 51 | 32 | 10 | 7 |
| 230T | 54 | 55 | 25 | 15 | 11 |
| 175T | 58 | 81 | 30 | 16 | 12 |
| 148T | 69 | 91 | 28 | 22 | 15 |

[1] METALLITE Metallized polyester screen of metallized monofilament polyester threads.
[2] Results can vary considerably based upon operator technique. Variation on the pressure of the squeegie by the operator will result in variation in coating thickness. Variations in temperature and squeegie hardness will also alter coating thickness.

If the viscosity of the above photoresist composition were altered, the coating thickness would also be altered—i.e., increasing the viscosity would result in thicker coatings and decreasing the viscosity would result in thinner coatings though below a given viscosity, the coating would be of poor quality. In similar fashion, if the solids content of the above photoresist was altered, the viscosity would be altered as well as the dry coat thickness relative to the wet coat thickness would also be altered—i.e., increasing the solids content would result in thicker dry coats while decreasing the solids content would result in thinner dry coats.

To practice the process of this invention, a screen is prepared by stretching a suitable screen fabric over a frame. If a light insensitive resist were used, the next step would comprise formation of a stencil in a desired image pattern over the screen by coating the screen with an emulsion of a suitable light sensitive material, imaging the emulsion and developing the same. In accordance with this invention, such a step is unnecessary because the light sensitive resist is screened over the substrate as an incomplete layer though such a step can be used if desired as explained above. Consequently, in accordance with the subject invention, a suitable substrate is placed beneath the screen and the light sensitive resist is squeegied over the surface of the substrate as an incomplete, and in some cases, preferably as a continuous coating. The coated substrate is then dried in air or in an oven, or both, dependent upon the drying requirements for the particular resist used. Following drying, the resist is imaged and developed in a conventional manner and the substrate permanently altered by etching, metal plating or the like.

The screens used for screening the photoresist over a substrate are essentially those of the prior art and the preferred screens are those of a type of fabric, mesh and thread diameter to maximize the open area of the screen. Stainless steel, nylon and silk screens are all acceptable, but metallized monofilament screens are preferred.

Any of the squeegies used in the prior art for screening resists can also be used in the process of the subject invention. The preferred squeegie will have a durometer hardness of between about 50 and 80. The blade should be kept sharp and the printing angle may vary between about 50 and 80 degrees, preferably between 60 and 70 degrees.

The substrate material coated with photoresist in accordance with this invention is any of a wide variety of substrate materials conventionally coated with resist in the formation of permanent images on a substrate. In the manufacture of printed circuits, the substrate would typically be a copper-clad epoxy or phenolic material for circuits made by a subtractive process or an unclad plastic material for circuits made by additive techniques.

One problem that has been encountered in the manufacture of through hole circuits using the screen resists of this invention has been the plugging of the through holes with the resist. As the resist is screened over a substrate with through holes, droplets of resist collect on the screen over the surface of the holes since there is no solid surface to which the resist may adhere. Consequently, in screening multiple substrates having identical through hole patterns through the same screen, the droplets of resist on the underside of the screen will enlarge over the surface of the hole and ultimately, be forced into the hole by the action of the squeegie. This problem can be readily avoided by placing each substrate under the screen out of registration with the next previous substrate.

The following example illustrates the manufacture of a printed circuit board by subtractive process using a screenable photoresist in accordance with the invention. A screen resist that may be used is one prepared from the photoresist composition set forth in Example 4 of U.S. Pat. No. 3,402,044, incorporated herein by reference with the ethylene glycol monomethyl ether reduced to one-half of the volume set forth in the patent. A levelling agent is preferably added in an amount of three percent of the solids.

A suitable substrate for the manufacture of the printed circuit boards would be a copper clad G-10 epoxy material measuring 4 by 6 inches. A screen may be prepared from a metallized polyester fabric sold under the Tradename METALLITE fabric. The mesh count per inch of the screen is suitably 330T with a fabric having a thread diameter of 38 microns, a mesh opening of 37 microns, an open surface of 23 percent and a fabric thickness of 65 microns.

The substrate material is placed under the screen and the photoresist screened over the substrate with a rubber squeegie. The wet coat thickness of the photoresist will be about 10 microns. The substrate coated with the photoresist may then be placed in an air-circulating oven maintained at 90° C. for 40 minutes to dry the resist coating. Following removal of the substrate from the oven, the dry photoresist layer should have a thickness of about 4 microns.

A latent negative image of the desired circuit may be formed in the photoresist coating by imaging the coating through a master. The latent image is then developed by contact with a developer for the photoresist such as that developer identified as Developer AZ-303A of Shipley Company Inc. The contact with the developer would be about 4 minutes at room temperature. A relief image would be formed in the photoresist coating exposing the underlying copper layer.

The circuit may then be formed by contact of the exposed copper with an etchant identified as Hydroetch Etchant of Shipley Company Inc. This etchant is primarily a hydrogen peroxide/sulfuric acid solution. The etchant dissolves exposed copper while the copper beneath the photoresist layer remains intact as it is protected by the photoresist layer. Following the etching step which leaves copper behind in a circuit pattern, the photoresist may, if desired, be removed from the underlying copper layer. The circuit thus formed may be overcoated with solder as is conventional in the printed circuit art.

To make a printed circuit using additive techniques, the screenable photoresist would be applied to an unclad polymer substrate in a fashion similar to the application of resist over the copper clad substrate. The resist layer would then be imaged and developed. The next step would be metal deposition in the bared portions of the substrate to build up the desired circuit pattern. The resist may be left on the substrate if it is a permanent resist.

The screenable photoresist of the subject invention can also be used as a permanent solder mask. In this application, it would be screened over all or part of an existing circuit, exposed and developed to expose those portions of the circuit over which solder is to be deposited. For this application, a high temperature resist is desirable.

We claim:

1. In a method for the formation of a printed circuit comprising the steps of applying a layer of light sensitive photoresist material over a substrate, drying the photoresist material to form a dry layer, exposing the photoresist layer to activating radiation, developing the photoresist to form a relief image and permanently modifying the substrate in a desired printed circuit pattern, the improvement whereby said light sensitive photoresist is applied to said substrate by screening the same onto said substrate through a screen fabric in an incomplete circuit pattern.

2. The method of claim 1 where the substrate contains through holes and the screen through which the photoresist is applied is not imaged in a circuit pattern except for plugs aligned with the through holes of the substrate.

3. The method of claim 1 where the photoresist is screened onto the substrate as a continuous, non-imaged layer.

4. The method of claim 1 where the photoresist material has a viscosity of at least 500 centipoise at 25° C.

5. The method of claim 4 where the viscosity ranges between 2,000 and 15,000 centipoise.

6. The method of claim 4 where the photoresist is a positive working photoresist.

7. The method of claim 6 where the sensitizer of the photoresist is slected from the group of diazo-oxides and o-quinone diazides.

8. The method of claim 7 where the sensitizer is an o-quinone diazide.

9. The method of claim 8 where the sensitizer is a naphthoquinone-diazide sulfonic acid ester.

10. The method of claim 6 where the substrate is a copper clad polymer and the photoresist is coated over the copper cladding.

11. The method of claim 10 where the permanent image is formed on the substrate by etching the copper cladding.

12. The method of claim 11 where the photoresist is removed following the step of etching the copper.

13. The method of claim 6 where the substrate is a non-conductor.

14. The method of claim 13 where the permanent image is formed by plating metal over those portions of the substrate bared by development of the photoresist.

15. The method of claim 14 where the photoresist is a permanent resist.

16. The method of claim 6 where the substrate is a non-conductor having a metallic printed circuit pattern thereover and the photoresist is coated over the circuit pattern.

17. The method of claim 16 where the photoresist is a light sensitive solder mask.

18. The method of claim 17 including the step of coating bared portions of the circuit pattern with solder.

* * * * *